(12) United States Patent
Lee et al.

(10) Patent No.: US 7,504,150 B2
(45) Date of Patent: *Mar. 17, 2009

(54) POLYMER-BASED CAPACITOR COMPOSITES CAPABLE OF BEING LIGHT-ACTIVATED AND RECEIVING DIRECT METALIZATION, AND METHODS AND COMPOSITIONS RELATED THERETO

(75) Inventors: Yueh-Ling Lee, Princeton Junction, NJ (US); Meredith L. Dunbar, Canal Winchester, OH (US); Harry Richard Zwicker, Glen Mills, PA (US); Brian C. Auman, Pickerington, OH (US)

(73) Assignee: E.I. Du Pont de Nemours & Company, Wilmington, DE (US)

( * ) Notice: Subject to any disclaimer, the term of this patent is extended or adjusted under 35 U.S.C. 154(b) by 641 days.

This patent is subject to a terminal disclaimer.

(21) Appl. No.: 11/153,176

(22) Filed: Jun. 15, 2005

(65) Prior Publication Data
US 2006/0286364 A1 Dec. 21, 2006

(51) Int. Cl.
*B32B 27/20* (2006.01)
*B32B 15/08* (2006.01)

(52) U.S. Cl. .................. 428/220; 428/323; 428/328; 428/332; 428/418; 428/421; 428/458

(58) Field of Classification Search .......... None
See application file for complete search history.

(56) References Cited

U.S. PATENT DOCUMENTS

| 3,056,881 A | 10/1962 | Schwarz |
| 4,159,414 A | 6/1979 | Suh et al. |
| 4,181,538 A | 1/1980 | Narayan et al. |
| 4,218,494 A | 8/1980 | Belmondo et al. |
| 4,286,250 A | 8/1981 | Sacchetti |
| 4,338,506 A | 7/1982 | Geller et al. |
| 4,489,230 A | 12/1984 | Yamamoto |
| 4,694,138 A | 9/1987 | Oodaira et al. |
| 5,166,308 A | 11/1992 | Kreuz et al. |
| 5,298,331 A | 3/1994 | Kanakarajan et al. |
| 5,721,150 A | 2/1998 | Pasch |
| 5,870,274 A | 2/1999 | Lucas |
| 5,883,000 A | 3/1999 | Pasch |
| 5,965,273 A | 10/1999 | Walpita et al. |
| 6,150,456 A | 11/2000 | Lee et al. |
| 6,319,564 B1 | 11/2001 | Naundorf et al. |
| 6,657,849 B1 | 12/2003 | Andresakis et al. |
| 2002/0046996 A1 | 4/2002 | Reil et al. |
| 2002/0076497 A1 | 6/2002 | Chen et al. |
| 2002/0110674 A1 | 8/2002 | Reil et al. |
| 2005/0064711 A1 | 3/2005 | Kliesch et al. |
| 2006/0083939 A1* | 4/2006 | Dunbar et al. ........... 428/473.5 |

FOREIGN PATENT DOCUMENTS

| EP | 0 256 778 A | 2/1998 |
| EP | 1 367 872 A2 | 12/2003 |
| EP | 1 531 657 A | 5/2005 |
| EP | 1 650 249 A1 | 4/2006 |
| EP | 1 675 131 | 6/2006 |
| EP | 1 734 071 A | 12/2006 |
| EP | 1 912 227 A | 4/2008 |
| JP | 58 12392 A1 | 1/1983 |

OTHER PUBLICATIONS

European Search Report.
U.S. Appl. No. 10/969,430, filed Oct. 20, 2004, Yueh-Ling Lee et al.
U.S. Appl. No. 11/153,206, filed Jun. 15, 2005, Yueh-Ling Lee et al.
U.S. Appl. No. 11/891,129, filed Aug. 9, 2007, Yueh-Ling Lee et al.
U.S. Appl. No. 12/169,186, filed Jul. 8, 2008, Yueh-Ling Lee et al.
U.S. Appl. No. 12/169,212, filed Jul. 8, 2008, Yueh-Ling Lee et al.
Database WPI Week 199414, Thomson Scientific, London, GB: AN 1994-114843 XP002488369 & JP 06 064009 A (Hitachi Chem Co Ltd) Mar. 8, 1994 * abstract * * paragraph [0012]*.

* cited by examiner

*Primary Examiner*—Monique R Jackson

(57) ABSTRACT

The present invention relates generally to polymer composites having dispersed therein both useful spinel crystal fillers and ferroelectric (and/or paraelectric) fillers wherein the composite is both light activatable and can be used as a planar capacitor material. The light activation is typically employed via a laser beam (or other light emitting device) where the material has a pattern formed thereon. Electrodes are typically formed on the material's surface after patterning is complete via electroless metal plating. These composite polymers can be used as planar capacitors embedded in printed wiring boards or in integrated circuit packages.

11 Claims, No Drawings

POLYMER-BASED CAPACITOR COMPOSITES CAPABLE OF BEING LIGHT-ACTIVATED AND RECEIVING DIRECT METALIZATION, AND METHODS AND COMPOSITIONS RELATED THERETO

FIELD OF INVENTION

The present invention relates generally to polymer-based composites having dispersed therein, certain spinel-type fillers in combination with ferroelectric (and/or paraelectric) fillers. The spinel-type fillers allow these composites to be light-activatable (typically via a laser beam). The light-activated portions of the composite can accept metal deposited from an electroless and/or electrolytic plating bath operation. The ferroelectric (and/or paraelectric) fillers present in the composite allow these materials to be used as a planar capacitor, typically as an embedded planar capacitor in a printed wiring board.

After light activation, the composites of the present invention can be directly metallized. Metal particles can adhere to the light-activated portions of the composite to form electrodes or thin circuit traces. The materials of the present invention can be light activated on one side or both sides of a film composite.

The composites of the present invention are typically in the form of a thin film. The films of the present invention can be used as stand alone materials or in their precursor form can be cast as a liquid mixture directly onto a metal foil and then cured to form a composite-metal laminate. Alternatively, the composite films of the present invention can be laminated to an already existing metal foil (typically a copper foil) or can have sputtered onto their surface (and then optionally electroplated onto their surface) a metal to form a composite-metal laminate.

Surface patterning of the film side of a film-metal laminate is typically performed by light activating a pattern onto the film's surface. As a standalone film (i.e., where there is no metal present), one side or both sides of the film can be light activated. The light activated pattern can then be metallized. The metallized portions can be used as capacitor electrodes on one surface of the film, and the metal foil on the other side can be used as a second electrode. Optionally, the metal foil can be chemically etched to also form metal patterns.

The polymer based dielectric planar capacitors of the present invention are generally useful as embedded capacitors in a printed circuit board application or in integrated circuit packages.

BACKGROUND OF THE INVENTION

Planar capacitors, typically used in embedded printed wiring boards, are commonly made from a dielectric binder having dispersed therein, a ferroelectric filler. These binders can typically include polyimides, epoxy, acrylics, or fiberglass reinforced materials. These planar capacitors can be produced as a thin film, or these composites can be cast in their liquid form onto a metal foil and then cured.

A 'subtractive process' is typically employed to form electrodes or circuit traces on a planar capacitor-metal laminate. The metal layer is converted to a metal pattern by chemically etching most of the metal material and using the planar capacitor layer as a support layer. However, such metal subtraction processes can be expensive, environmentally unfriendly, and increasingly problematic when attempting to meet increasingly difficult industry performance requirements.

U.S. Pat. No. 5,870,274 to Lucas, is directed to a method of forming a bypass capacitor element within a printed circuit board (PCB). The process includes the steps of arranging one or more uncured dielectric sheets with conductive foils on opposite sides, and laminating the conductive foils to the dielectric sheet as the PCB is formed by a final lamination step.

EP 1 367 872 A2 to Goosey et al., is directed to a laser activated dielectric material and an electroless deposition process, involving a sensitizing pre-dip step and a milling step (for incorporating titanium dioxide, aluminum nitride or zirconium dioxide filler into the dielectric coating material) and then ultimately converting the filler (using laser energy) into a metallization catalyst (i.e., an area that can receive metal via electroless and/or electrolytic metal deposition).

SUMMARY OF THE INVENTION

The present invention is directed to polymer-based composites having dispersed therein two filler components where the first filler component makes the composite light activatable and the second filler component makes the composite useful as a polymer-based planar capacitor.

The polymer is present in an amount from 12, 15, 20, 25, 30, 35, 40, 45, 50, 55, 60, 65, 70, 75, 80, 85, or 87 weight-percent of the total weight of the polymer composite. The first filler is a spinel crystal filler present in an amount from 3, 4, 5, 6, 7, 8, 9, 10, 11, 12, 13, 14, 15, 20, or 25 weight-percent of the total weight of the polymer composite. The second filler is a capacitor filler and is present in an amount from 10, 15, 20, 25, 30, 35, 40, 45, 50, 55, 60, 65, 70, 75, 80, or 85 weight-percent of the total weight of the polymer composite.

The composite has a thickness ranging from 1, 2, 3, 4, 5, 7, 8, 9, 10, 12, 14, 16, 18, 20, 25, 30, 35, 40, 45, 50, 55, 60, 65, 70, 75, 80, 85, 90, 95, 100, 125, 150, 175 and 200 microns. These composites also have a dielectric constant between and including any two of the following numbers 4, 5, 10, 15, 20, 25, 30, 35, 40, 45, 50, 55, and 60.

The polymers used to bind the composites of the present invention include polyimides, but can also include other binders such as epoxy resins, bismaleimide triazines, fluoropolymers, polyesters, liquid crystal polymers, polyamides, cyanate esters, or combinations thereof.

The fillers of the present invention can be dispersed in a polyimide precursor initially having an average particle size (during incorporation into the matrix) of between and including any two of the following numbers 50, 100, 300, 500, 800, 1000, 2000, 3000, 4000, 5000 and 10000 nanometers. Typically, the fillers of the present invention can first be dispersed in an organic solvent (either with or without the aid of a dispersing agent) and in a subsequent step, dispersed in the polyimide precursor to form a blend. The filled polyimide blend can then be cast onto a flat surface (or drum), heated, dried, and cured to form a polyimide film composite having the spinel-type filler of the present invention dispersed therein.

The polyimide film composites of the present invention can then be processed through a light activation step, typically employing the use of a laser beam. The laser beam can be focussed, using optical elements, and directed to a portion of the film's surface where a circuit-trace, or other electrical component, is later desired. Once 'light activated', the light activated portion can be used as a 'path' (or sometimes a spot) for a circuit trace to be formed later, by a metal plating step for example, typically an electroless plating step.

The number of processing steps employed to make a circuit using the composite films of the present invention are often far fewer relative to the number of steps in the subtractive processes typically employed by the industry today.

DETAILED DESCRIPTION OF THE PREFERRED EMBODIMENTS

In one embodiment of the present invention, the polymer-based composites are light-activatable and have a dielectric constant between any two of the following numbers 4, 5, 10, 15, 20, 25, 30, 35, 40, 45, 50, 55 and 60.

Generally, these composites can be used in planar capacitor applications in printed wiring boards where the thickness of the polymer-based composite layer is between any two of the following numbers, 1, 2, 3, 4, 5, 7, 8, 9, 10, 12, 14, 16, 18, 20, 25, 30, 35, 40, 45, 50, 55, 60, 65, 70, 75, 80, 85, 90, 95, 100, 125, 150, 175 and 200 microns.

The thickness of the polymer-based composite layer can be used to calculate both a light extinction coefficient factor and a dielectric constant for the composite.

As used herein, the light extinction coefficient (sometimes referred to herein to simply as 'alpha') factor is a calculated number. This number is derived from measuring the intensity of visible-to-infrared light through a film and taking the ratio of that intensity to the light intensity (of the same light) through air. Typically, a spectrometer is used.

Generally, for purposes of the present invention, useful light extinction coefficient factors range between any two of the following numbers, 0.05, 0.06, 0.07, 0.08, 0.09, 0.1, 0.2, 0.3, 0.4, 0.5 and 0.6 per micron.

The measured visible-to-infrared light through a composite is divided by the measured visible-to-infrared light through air. One can then take the natural log of this ratio and multiply that number by (−1). Finally, this value is then divided by the thickness of the film measured in microns. Thus, a visible-to-infrared light extinction coefficient factor can be calculated.

The general equation for calculating the light extinction coefficient factor is represented by the general formula:

$$\text{Alpha} = -1 \times [ln(I(X)/I(O))]/t$$

where I(X) represents the intensity of light transmitted through the material, where I(O) represent the intensity of light transmitted through air, and where t represents the thickness of the material. Typically, the film thickness in these calculations is expressed in microns.

Particular wavelengths of light are useful in the measurements discussed herein. These wavelengths are typically in that range of light covering the visible-to-infrared light portion of the spectrum. The films of the present invention require a sufficient degree of 'light-absorption capability' to work effectively in many high-speed 'light activation' steps, steps typically employing the use of certain high speed laser machines.

For example, in one type of laser-light activation step, the present inventor found that the composites of the present invention are capable of absorbing a significant amount of light energy. As such, these composites can become 'light activated' and can have formed thereon, a well-defined circuit trace pattern or metal electrode. This can also be done in a relatively short time compared to other composites. The light activated portion has a 'modified surface' (i.e., perhaps a rough contour) that allows that portion of the composite surface to have metal directly plated to it. The portion of the film's surface, next to the light activated portion (i.e., the non-light activated portion) will typically not be capable taking up metal from a metal plating bath as easily, or not at all. As such, under certain plating operations, the substrates of the present invention can have plated to it a metal (either as an electric circuit pattern or perhaps a metal electrode pad) onto the film surface.

The process above is generally preferable over other processes that employ a 'subtractive' means of forming circuit patterns or electrodes. In a subtractive process, sometimes greater than 50% of the metal must be removed.

The polymer composites of the present invention comprise spinel crystalline fillers, generally homogeneously dispersed, in a polymer binder component in an amount within a range between (and including) any two of the following weight-percentages 3, 4, 5, 6, 7, 8, 9, 10, 12, 15, 18, 20, 24, 25, 28, 30, 32, 34, 35, 36, 38, 40, 42, 44, 46, 48, 50, 52, 54, 56, 58 and 60 weight-percent.

In one embodiment of the present invention, the spinel crystal fillers are represented by the general formula:

$$AB_2O_4$$

where A, is a metal cation typically having a valence 2, and is selected from a group comprising cadmium, chromium, manganese, nickel, zinc, copper, cobalt, iron, magnesium, tin, titanium, and combinations of two or more of these, and where B is a metal cation typically having a valence of 3, and is selected from the group comprising chromium, iron, aluminum, nickel, manganese, tin, and combinations of two or more of these, and where O is primarily, if not in all cases, oxygen.

In one embodiment of the present invention, the metal cation A provides the primary cation component of a first metal oxide cluster, "metal oxide cluster 1" (typically a tetrahedral structure) of a spinel structure. A metal cation B provides the primary cation component of a second metal oxide cluster, "metal oxide cluster 2" (typically an octahedral structure).

In another embodiment, within the above groups A and B, any metal cation having a possible valence of 2 can be used as an "A". In addition, any metal cation having a possible valence of 3 can be used as a "B" provided that the geometric configuration of "metal oxide cluster 1" is different from the geometric configuration of "metal oxide cluster 2".

In yet another embodiment, A and B can be used as the metal cation of "metal oxide cluster 2" (typically the octahedral structure). This is true in the particular case of an 'inverse' spinel-type crystal structure typically having the general formula $B(AB)O_4$.

The present invention relates to polymer composites useful as a planar capacitor in a printed wiring board. As such, the composites of the present invention can have a relatively high dielectric constant so that the composite material can store electrical charge. Thus, the composites of the present invention comprise not only a spinel crystal filler as mentioned above, but also a capacitor filler. Capacitor fillers, as defined herein, is intended to mean either a ferroelectric filler or a paraelectric filler (or a combination of the two). The capacitor fillers provide the composite of the present invention with a high dielectric constant to make them useful as a capacitor.

Filled polymer films containing too much spinel crystal filler (or too much capacitor filler) can sometimes be too brittle to handle in downstream processing as these films can tend to lose their flexibility. In addition these films may not have adequate dielectric strength (because of there being too much filler present in the composite) to be useful as a dielectric layer.

The ferroelectric fillers and paraelectric fillers of the present invention can simply be referred to as 'capacitor fillers' since these fillers can be used interchangeably and in combination with one another. As used herein, ferroelectric fillers include, but are not limited to, lead zirconate titanate, barium titanate, calcium, bismuth, iron, lanthanum, strontium, lead meta-niobate, lead metatantalate, strontium barium titanate, sodium barium niobate, potassium barium niobate, rubidium barium niobate. As used herein, paraelectric fillers include, but are not limited to, $TiO_2$, $Ta_2O_5$, $HfO_2$, $Nb_2O_5$, $Al_2O_3$, and Steatite.

Ferroelectric and paraelectric fillers can have a dielectric constant typically between 4 and 150. These fillers also typically have a relatively high insulation resistance (low leakage current) and breakdown voltage in bulk form. These materials also have a high electrical insulation resistance.

Generally speaking, capacitor fillers of the present invention are ceramic particles that show a linear response of electrical charge (or polarization) versus voltage. These fillers show a total reversible polarization of charge within the crystal structure after the applied electrical field is removed. Traditionally, electrical capacitor fillers are used to increase the dielectric constant of a dielectric substrate or composite. Generally, to achieve high capacitance for a filled polymer film four factors are available: (i) to increase the dielectric constant of the filler powder and/or the polymer binder, (ii) to increase the concentration of the filler powder, (iii) to decrease the thickness of the filled polymer film or (iv) to increase the surface area of the top and bottom electrodes.

The capacitor fillers of the present invention typically exhibit high breakdown voltages of approximately 1000 volts per mil (or greater) and volume resistivities of 10e12 ohm-cm or greater in their bulk form. Typically, these powders have an average particle size ($D_{50}$) of less than 2 microns. In one embodiment of the present invention, the average particle size is in the range of 0.1 to 0.3 microns. The capacitor fillers are typically present in the polyimide composites in a range between and including any two of the following numbers, 10, 15, 20, 25, 30, 35, 40, 45, 50, 55, 60, 65, 70, 75, 80, or 85 weight-percent of the total weight of the polyimide composite.

The polymer component (i.e. the polymer 'binder' of the composites of the present invention) can be many polymers. One particularly useful polymer is a polyimide. Other useful polymer binders include, but are not limited to, epoxy resins, bismaleimide triazines, fluoropolymers, polyesters, liquid crystal polymers, polyamides, cyanate esters, or combinations thereof. A polyimide can typically be prepared from a dianhydride, or the corresponding diacid-diester, diacid halide ester, or tetra-carboxylic acid derivative of the dianhydride, and a diamine. For purposes of the present invention, a wide range dianhydrides and diamines were discovered to be particularly useful in the preparation of these polyimide film composites.

The polyimide component of these composites is typically synthesized by a polycondensation reaction involving the reaction of one or more aromatic diamine components with one or more aromatic dianhydride components. Generally, a polyimide can be produced by combining the above monomers together with a solvent to form a polyamic acid solution (also called a polyamide solution or polyimide precursor solution). The dianhydride and diamine components are typically combined, in a molar ratio of aromatic dianhydride component to aromatic diamine component, from 0.90 to 1.10, or from 0.98 to 1.02. Molecular weight can be adjusted by adjusting the molar ratio of the dianhydride and diamine components.

In one embodiment of the present invention, a polyamic acid solution (and/or the polyamic acid casting solution) can be prepared in an organic solvent at a polymer concentration ranging between and including any two of the following numbers 5, 10, 12, 15, 20, 25, 27, 30, 35, 40, 45, 50, 55, 60, 65, 70, 75, 80, 85, or 90 weight-percent.

Useful organic solvents, for the synthesis of the polyimides of the present invention, are preferably capable of dissolving the polyimide precursor materials. Such a solvent should also have a relatively low boiling point, such as below 225° C., so the polyimide can be dried at moderate (i.e., more convenient and less costly) temperatures. A boiling point of less than 210, 205, 200, 195, 190, or 180° C. is preferred.

Solvents of the present invention may be used alone or in combination with other solvents (i.e., cosolvents). Useful organic solvents include: N-methylpyrrolidone (NMP), dimethylacetamide (DMAc), N,N'-dimethyl-formamide (DMF), dimethyl sulfoxide (DMSO), tetramethyl urea (TMU), N,N'-dimethyl-N,N'-propylene urea (DMPU), and gamma-butyrolactone. In one embodiment, preferred solvents include N-methylpyrrolidone (NMP) and dimethylacetamide (DMAc).

Co-solvents can also be used generally at about five to 50 weight-percent of the total solvent. Useful co-solvents include xylene, toluene, benzene, diethyleneglycol diethyl ether, 1,2-dimethoxyethane (monoglyme), diethylene glycol dimethyl ether(diglyme), 1,2-bis-(2-methoxyethoxy) ethane (triglyme), bis [2-(2-methoxyethoxy)ethyl)]ether (tetraglyme), bis-(2-methoxyethyl)ether, tetrahydrofuran, propylene glycol methyl ether, propylene glycol methyl ether acetate, "Cellosolve™" (ethylene glycol ethyl ether), butyl "Cellosolve™" (ethylene glycol butyl ether), "Cellosolve™ acetate" (ethylene glycol ethyl ether acetate), "butyl Cellosolve™ acetate" (ethylene glycol butyl ether acetate), and the like.

For purposes of the present invention, high $T_g$ polyimides are defined herein as those polyimides having a $T_g$ greater than or equal to 300, 325, 350 and 375° C. (or polyimides having no measurable Tg at all). Low $T_g$ polyimides are those polyimides having a $T_g$ of less than 300, 275, 250, 225, 200,175 or 150° C. In one embodiment of the present invention, any aromatic dianhydride, or combination of aromatic dianhydrides, in addition to any diamine or combination of aromatic diamines, can be used as monomers to form either a high $T_g$ or low $T_g$ polyimide.

The dianhydrides of the present invention may be used alone or in combination with one another. These dianhydrides can be used in their tetra-acid form (or as mono, di, tri, or tetra esters of the tetra acid), or as their diester acid halides (chlorides). However in some embodiments, the dianhydride form can be preferred, because it is generally more reactive than the acid or the ester.

Examples of suitable aromatic dianhydrides include, 1,2, 5,6-naphthalene tetracarboxylic dianhydride, 1,4,5,8-naphthalene tetracarboxylic dianhydride, 2,3,6,7-naphthalene tetracarboxylic dianhydride, 2-(3',4'-dicarboxyphenyl) 5,6-dicarboxybenzimidazole dianhydride, 2-(3',4'-dicarboxyphenyl) 5,6-dicarboxybenzoxazole dianhydride, 2-(3',4'-dicarboxyphenyl) 5,6-dicarboxybenzothiazole dianhydride, 2,2',3,3'-benzophenone tetracarboxylic dianhydride, 2,3,3',4'-benzophenone tetracarboxylic dianhydride, 3,3',4, 4'-benzophenone tetracarboxylic dianhydride (BTDA), 2,2', 3,3'-biphenyl tetracarboxylic dianhydride, 2,3,3',4'-biphenyl tetracarboxylic dianhydride, 3,3',4,4'-biphenyl tetracarboxylic dianhydride (BPDA), bicyclo-[2,2,2]-octen-(7)-2,3,5,6-tetracarboxylic-2,3,5,6-dianhydride, 4,4'-thio-diphthalic anhydride, bis(3,4-dicarboxyphenyl)sulfone dianhydride, bis (3,4-dicarboxyphenyl)sulfoxide dianhydride (DSDA), bis(3,4-dicarboxyphenyl oxadiazole-1,3,4)p-phenylene dianhydride, bis(3,4-dicarboxyphenyl) 2,5-oxadiazole 1,3,4-dianhydride, bis 2,5-(3',4'-dicarboxydiphenylether) 1,3,4-oxadiazole dianhydride, 4,4'-oxydiphthalic anhydride (ODPA), bis (3,4-dicarboxyphenyl)thio ether dianhydride, 2,2'-bis[4-(3,4-dicarboxyphenoxy)phenyl]propane dianhydride (BPADA), 2,2-bis-(3,4-dicarboxyphenyl) 1,1,1,3,3,3,-hexafluoropropane dianhydride (6FDA), 5,5-[2,2,2]-trifluoro-1-(trifluoromethyl)ethylidene, bis-1,3-isobenzofurandione, 1,4-bis(4,4'-oxyphthalic anhydride)benzene, bis(3,4-dicarboxyphenyl)methane dianhydride, cyclopentadienyl tetracarboxylic acid dianhydride, cyclopentane tetracarboxylic dianhydride, ethylene tetracarboxylic acid dianhydride, perylene 3,4,9,10-tetracarboxylic dianhydride, pyromellitic dianhydride (PMDA), tetrahydrofuran tetracarboxylic dianhydride, 1,3-bis-(4,4'-oxydiphthalic anhydride)benzene, 2,2-bis(3,4-dicarboxyphenyl)propane dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, benzene-1,2,3,4-tetracarboxylic dianhydride; and thiophene-2,3,4,5-tetracarboxylic dianhydride.

For either a low $T_g$ or a high $T_g$ polyimide base polymer, a suitable aromatic diamine includes, but is not limited to, m-phenylenediamine, p-phenylenediamine, 2,5-dimethyl-1,4-diaminobenzene, trifluoromethyl-2,4-diaminobenzene, trifluoromethyl-3,5-diaminobenzene, 2,5-dimethyl-1,4-phenylenediamine (DPX), 2,2-bis-(4-aminophenyl) propane, 4,4'-diaminobiphenyl, 4,4'-diaminobenzophenone, 3,4'-diaminobenzophenone, 4,4'-diaminodiphenylmethane, 4,4'-diaminodiphenyl sulfide, 4,4'-diaminodiphenyl sulfone, 3,3'-diaminodiphenyl sulfone, bis-(4-(4-aminophenoxy)phenyl sulfone (BAPS), 4,4'-bis-(aminophenoxy)biphenyl (BAPB), 4,4'-diaminodiphenyl ether, 3,4'-diaminodiphenyl ether, 4,4'-isopropylidenedianiline, 2,2'-bis-(3-aminophenyl)propane, N,N-bis-(4-aminophenyl)-n-butylamine, N,N-bis-(4-aminophenyl) methylamine, 1,5-diaminonaphthalene, 3,3'-dimethyl-4,4'-diaminobiphenyl, m-amino benzoyl-p-amino anilide, 4-aminophenyl-3-aminobenzoate, N,N-bis-(4-aminophenyl)aniline, 2,4-diaminotoluene, 2,5-diaminotoluene, 2,6-diaminotoluene, 2,4-diamine-5-chlorotoluene, 2,4-diamine-6-chlorotoluene, 2,4-bis-(beta-amino-t-butyl)toluene, bis-(p-beta-amino-t-butyl phenyl) ether, p-bis-2-(2-methyl-4-aminopentyl)benzene, m-xylylene diamine, p-xylylene diamine, and the like.

Other useful aromatic diamines include, 1,2-bis-(4-aminophenoxy)benzene, 1,3-bis-(4-aminophenoxy)benzene, 1,2-bis-(3-aminophenoxy)benzene, 1,3-bis-(3-aminophenoxy)benzene, 1-(4-aminophenoxy)-3-(3-aminophenoxy)benzene, 1,4-bis-(4-aminophenoxy)benzene, 1,4-bis-(3-aminophenoxy)benzene, 1-(4-aminophenoxy)-4-(3-aminophenoxy)benzene, 2,2-bis-(4-[4-aminophenoxy]phenyl)propane (BAPP), 2,2'-bis-(4-aminophenyl)-hexafluoro propane (6F diamine), 2,2'-bis-(4-phenoxy aniline)isopropylidene, 2,4,6-trimethyl-1,3-diaminobenzene, 4,4'-diamino-2,2'-trifluoromethyl diphenyloxide, 3,3'-diamino-5,5'-trifluoromethyl diphenyloxide, 4,4'-trifluoromethyl-2,2'-diaminobiphenyl, 2,4,6-trimethyl-1,3-diaminobenzene, 4,4'-oxy-bis-[2-trifluoromethyl)benzene amine] (1,2,4-OBABTF), 4,4'-oxy-bis-[3-trifluoromethyl) benzene amine], 4,4'-thio-bis-[(2-trifluoromethyl)benzene-amine], 4,4'-thiobis[(3-trifluoromethyl)benzene amine], 4,4'-sulfoxyl-bis-[(2-trifluoromethyl)benzene amine, 4,4'-sulfoxyl-bis-[(3-trifluoromethyl)benzene amine], 2,2'-bis (trifluoromethyl)-4,4'-diaminobiphenyl (TFMB), and 4,4'-keto-bis-[(2-trifluoromethyl)benzene amine].

Aliphatic diamines (and cycloaliphatic diamines) can also be used to make the polyimides of the present invention. Useful aliphatic diamines include, but are not limited to, 1,4-tetramethylenediamine, 1,5-pentamethylenediamine (PMD), 1,7-heptamethylene diamine, 1,8-octamethylenediamine, 1,9-nonamethylenediamine, 1,10-decamethylenediamine (DMD), 1,11-undecamethylenediamine, 1,12-dodecamethylenediamine (DDD), 1,16-hexadecamethylenediamine. The preferred aliphatic diamine is hexamethylene diamine (HMD).

Useful methods for producing polyimide film in accordance with the present invention can be found in U.S. Pat. No. 5,166,308 and U.S. Pat. No. 5,298,331 and are incorporated by reference into this specification for all teachings therein. Numerous variations are also possible including:

(a.) a method wherein the diamine components and dianhydride components are preliminarily mixed together and then the mixture is added in portions to a solvent while stirring.

(b.) a method wherein a solvent is added to a stirring mixture of diamine and dianhydride components. (contrary to (a) above)

(c.) a method wherein diamines are exclusively dissolved in a solvent and then dianhydrides are added thereto at such a ratio as allowing to control the reaction rate.

(d.) a method wherein the dianhydride components are exclusively dissolved in a solvent and then amine components are added thereto at such a ratio to allow control of the reaction rate.

(e.) a method wherein the diamine components and the dianhydride components are separately dissolved in solvents and then these solutions are mixed in a reactor.

(f.) a method wherein the polyamic acid with excessive amine component and another polyamic acid with excessive dianhydride component are preliminarily formed and then reacted with each other in a reactor, particularly in such a way as to create a non-random or block copolymer.

(g.) a method wherein a specific portion of the amine components and the dianhydride components are first reacted and then the residual diamine components are reacted, or vice versa.

(h.) a method wherein the conversion chemicals are mixed with the polyamic acid to form a polyamic acid casting solution and then cast to form a gel film.

(i.) a method wherein the components are added in part or in whole in any order to either part or whole of the solvent, also where part or all of any component can be added as a solution in part or all of the solvent.

(j.) a method of first reacting one of the dianhydride components with one of the diamine components giving a first polyamic acid. Then reacting the other dianhydride component with the other amine component to give a second polyamic acid. Then combining the amic acids in any one of a number of ways prior to film formation.

The polyamic acid solutions of the present invention (and/or casting solutions) can optionally further contain any one of a number of additives. Such additives can be used as processing aids (e.g., oligomers), antioxidants, light stabilizers, light extinction coefficient modifier, flame retardant additives, anti-static agents, heat stabilizers, ultraviolet light absorbing agents, inorganic fillers and various reinforcing agents.

In one or more steps, a polyimide (or polyimide precursor like a polyamic acid) is solvated to a sufficiently low viscosity (typically, a viscosity of less than 50, 40, 30, 20, 15, 10, 9, 8, 7, 6, 5, 4, 3, 2, 1.5, and 1 poise to allow the spinel crystal filler and capacitor filler (which can also be suspendable in a like or same solvent) to be adequately dispersed within the polyimide matrix. The dispersion of the fillers is typically done in such a manner as to avoid undue agglomeration of the primary particles in the solution, the dispersion, or the final polyimide binder. The fillers can be dispersed separately, or together in one dispersion. Unwanted agglomeration of the filler particles in the binder can cause unwanted interfacial voids, or other problems, in the final film composite.

The filler particles of the present invention can be dispersed in the polyimide precursor material (i.e., polyamic acid) directly, or can be dispersed in a like or similar solvent prior to dispersion in the polymer matrix. In one embodiment of the present invention, the particles are dispersed in dimethylacetamide solvent and then mixed, using a high shearing mechanical mixing apparatus, with a polyamic acid. Typically, the filler particles can be mixed in a solvent, until the particles have reached an average particle size of between any two of the following numbers 50, 100, 300, 500, 800, 1000, 2000, 3000, 4000, 5000, and 10000 nanometers. The particle dispersion is then mixed using an additional high-speed, or high-shear, mixing apparatus into a polyimide precursor material. Optionally, filler particles can be dispersed using a variety of more favorable solvents. In some cases, these filler dispersions can have added to them a variety of known dispersing agents (e.g., like a polyamic acid) to assist in forming a stable particle dispersion for use in commercial scale production.

The fillers (both the spinel crystal structure and the capacitor filler) of the present invention generally have an average particle size between and including any two of the following numbers 50, 100, 200, 250, 300, 350, 400, 450, 500, 1000, 2000, 3000, 4000, 5000 and 10000 nanometers. Generally, at least 80, 85, 90, 92, 94, 95, 96, 98, 99 or 100 percent of the dispersed filler is within the above size range(s). Crystal size, in the polymer binder, can be determined by a laser particle analyzer, such as an LS130 particle size analyzer with small volume module made by Coulter®.

Ultimately, the precursor polymer (typically a polyamic acid) and the filler particles, are mixed together to form a relatively homogeneous blend. The blended polymer mixture is then converted into a polyimide composite material where the solids content is typically greater than 98.0, 98.5, 99.0 or 99.5 weight-percent.

The fillers of the present invention may sometimes be easily dispersed in a polyimide precursor solution, often with little or no additional shearing force required, slurries formed can contain often fewer than 100, 50, 20, 10, 8, 6, 5, 4, 3, 2, or 1 parts per million (ppm) undesired agglomerates. For purposes of the present invention, undesirable agglomerates are defined as a collection of bound (adjoining) spinel crystal fillers (or capacitor filler particles) having an average particle size of greater than 10, 11, 12, 13, 14, or 15 microns. Typically, both the spinel fillers and capacitor fillers of the present invention do require some milling or filtration to breakup unwanted particle agglomeration. This is typical when attempting to adequately disperse nano-sized conventional fillers into a polyimide precursor material. Such milling and filtration can be costly, and may not be capable of removing all unwanted agglomerates.

In one embodiment of the present invention, both the spinel crystal filler and the capacitor filler are dispersible, and suspendable, at 20 weight-percent in dimethylacetamide solvent. After dispersing and suspending either filler into a solvent (optionally with the aid of a high-shear mechanical mixer) less than 15, 10, 8, 6, 4, 2 or 1 weight-percent of the filler particles by weight precipitate out of solution when the solution was kept at rest for 72 hours at 20° C.

The spinel crystals and capacitor fillers, either in the form of a powder, a liquid dispersion or polymer blend dispersion, can be mixed with a polyamic acid to form a polyamic acid casting solution. The polyamic acid casting solution can further other inorganic fillers for other purposes. Other inorganic fillers include thermally conductive fillers, like certain metal oxides, and electrically conductive fillers like metals or carbon. Common inorganic fillers are alumina, silica, silicon carbide, diamond, clay, granite, boron nitride, aluminum nitride, titanium dioxide, dicalcium phosphate, and fumed metal oxides. Common organic fillers include electrically conductive polymers like polyaniline, polythiophene, polypyrrole, polyphenylenevinylene, and polydialkylfluorenes.

In one embodiment, a light extinction coefficient modifier can be added as a partial substitute for the spinel crystal filler component. Appropriate amounts of substitution can range from, between and including any two of the following numbers, 1, 2, 3, 4, 5, 10, 15, 20, 25, 30, 35, or 40 weight percent of the total amount of spinel crystal filler component. In one case, about 10 weight percent of the spinel crystal filler can be substituted with a carbon powder or graphite powder. The polymer composite formed therefrom can have a sufficient amount of spinel crystal structure present in the composite to allow metal ions (once light-activated) to plate effectively on the film's surface during plating. The above-mentioned amount of substitute (e.g., carbon powder) can also darken the composite so that the material can absorb a sufficient amount of light energy (i.e., an amount of light energy that effectively light activates the surface of the material) to become light-activated.

The solvated mixture (the polyamic acid casting solution containing the fillers) can then be cast or applied onto a support, such as an endless belt or rotating drum, to give a film. Next, the solvent containing-film can be converted into a self-supporting film by baking at an appropriate temperature (thermal curing) optionally with conversion chemical reactants (i.e., chemical curing) to produce a dry film. The film can then be separated from the support before complete drying and can be molecularly oriented by additional curing via a tentering oven. The final composite film is typically a dry film that is fully thermally cured. Fully thermally-cured for purposes of the present invention is intended to mean a polyimide wherein at least 90, 92, 94, 96, 98, 99 or 99.9 percent of the amic-acid moieties are converted to imide moieties. Dry film, as used herein, is a defined as a film, or film composite, wherein there is less than 2, 1.5, 1.0, 0.5, 0.1, 0.05, and 0.01 weight-percent volatile (e.g., solvent or water) remaining in the polyimide film composite.

In one embodiment of the present invention, a polyimide film composite is made having a thickness of between, and including, any two of the following numbers 1, 2, 3, 4, 5, 7, 8, 9, 10, 12, 14, 16, 18, 20, 25, 30, 35, 40, 45, 50, 55, 60, 65, 70, 75, 80, 85, 90, 95, 100, 125, 150, 175 and 200 microns.

The optical property (e.g., visible-to-infrared light extinction coefficient) necessary to produce a polyimide film composite ideal for high speed light-activation processing (i.e., laser beam patterning on the surface of a film) is critical to this invention. In order to improve the speed at which these composites can be light-activated, it is important to have a suitable amount of certain spinel crystal fillers in the polymer matrix. It is also important to choose a type of spinel crystal filler (or spinel with additional light absorber) that provides the composite formed therefrom with the appropriate degree of light absorption capability.

Similarly to the polyimide binder mentioned above, the spinel crystal filler can also be specifically selected to provide a composite having a well-defined light-activated pathway after intense light-energy has been applied to the film. For example, a well-defined light-activated pathway can more easily produce well-defined circuit metal traces after the light-activated material is submerged in an electroless plating bath. Metal is typically deposited onto the light-activated portion of a film's surface via an electroless plating step.

In accordance with the present invention, the monomers used to form a polyimide (i.e., the polyimide binder) are chosen to specifically provide important physical properties to the composite film. Beneficial properties specifically sought include, but are not limited to, good adhesibility (i.e., metal adhesion or adhesion to a metal), high and/or low modulus depending on the application, high mechanical elongation, a low coefficient of in-plane thermal expansion (CTE), a low coefficient of humidity expansion (CHE), a particular glass transition temperature, and high tensile strength in some applications.

In one embodiment of the present invention, the polyimide film composites have an in-plane coefficient of thermal expansion between and including any two of the following numbers 70, 68, 66, 64, 62, 60, 58, 56, 54, 52, 50, 48, 46, 44, 42, 40, 38, 36, 34, 32, 30, 28, 26, 24, 22, 20, 18, 16, 14, 12, 10, 8, 6, 4, 2, 0, −4, −8, and −10 ppm/° C.

In one embodiment, different polyimide compositions are used to form a multi-layer polyimide substrate. The multi-layer substrate polyimide can be used as at least a portion of a printed circuit board ("PCB"), chip scale package, wafer scale package, high density interconnect board (HDI), module, "LGA" Land grid array, "SOP" (System-on Package) Module, "QFN" Quad Flat package-No Leads, "FC-QFN" Flip Chip Quad Flat package-No leads, or other similar-type electronic substrate. Printed circuit boards (either covered with, or incorporating therein, the films of the present invention) may be single sided, double sided, may be incorporated into a stack, or a cable (i.e. a flexible circuit cable). Stacks can include several individual circuits to form what is commonly referred to as a multi-layer board. Any of these types of circuits may be used in a solely flexible or rigid circuit or, or may be combined to form a rigid/flex or flex/rigid printed wiring board or cable.

In one embodiment of the present invention, a high $T_g$ polyimide layer comprising a capacitor filler, and a low $T_g$ polyimide spinel crystal filler composite layer, can be simultaneously cast via co-extrusion, or a single casting step involving a second, subsequent casting step. At the time of casting, the polyimides can be in the form of a polyamic acid solution. The cast solutions form an uncured polyamic acid film, filled or unfilled, that is later cured to a polyimide.

In the case of a multi-layer polyimide film, spinel crystal filler can be put in the outer layers, and the inner layer can comprise the capacitor filler. To increase capacitance, the outer layers may also contain capacitor filler. In addition, the concentration (or loading) of the spinel crystal filler can be different, or the same, in each individual layer depending on the final properties desired. In one embodiment, a low Tg polyimide composite layer (containing a low Tg polyimide and spinel filler) can be used in conjunction with a high modulus polyimide core layer comprising a capacitor filler. In another embodiment, all three layers can use a high modulus polyimide and only the outer layers may contain spinel crystal filler.

In modern circuitry applications z-directional dimensional stability (through the film thickness, or "out of plane"), especially in films where the dielectric is less than 25 microns, is increasingly important. The films of the present invention generally have excellent z-axis dimensional stability (z-axis coefficient of thermal expansion) by providing an expansion factor of less than 120 ppm/° C., typically 90 ppm/° C. The coefficient of in-plane thermal expansion is measured by ASTM Method IPC-650 2.4.41 and is included herein by reference.

In one embodiment of the present invention, a means is provided whereby, electromagnetic radiation (i.e., light-energy via a laser beam) is applied to the polyimide film composite's surface. In one embodiment of the present invention, a polyimide composite can be light activated using a commercially available, Esko-Graphics Cyrel® Digital Imager (CDI). The imager can be operated in a continuous wave mode or can be operated in a pulse mode. The purpose of applying this energy, on a particular predetermined portion of the film, is to light-activate the film surface. As defined herein, the term "light-activated" is defined as a portion of a surface, on a polyimide, wherein a metal ion can bond to the surface in a manner capable of forming a metal circuit trace. In the event that only a small portion of metal can be electroless plated onto the light activated portion of a film's surface (an amount of metal typically not capable of forming an electrically conductive pathway), the film in general is not considered to be 'light activatable' for purposes herein.

Typically, a 50-watt Yttrium Aluminum Garnet (YAG) laser can be employed to 'light-activate' the composites of the present invention. However, other types of lasers can be used. In one embodiment, a YAG laser (e.g. Chicago Laser Systems Model CLS-960-S Resistor Trimmer System) can be used to emit energy between 1 and 100 watts, ranging at about 355, 532 or 1064 nm wavelengths light.

Generally, the wavelength of the laser light useful to light-activate a portion of the surface of the composites of the present invention can range from a wavelength between and including any two of the following numbers 150 nm, 355 nm, 400 nm, 532 nm, 1064 nm, or 3000 nm.

Generally, a laser beam can be modulated, using an acousto-optic modulator/splitter/attenuator device (AOM), and can be used to produce up to 23 watts in a single beam. In one embodiment, the composites of the present invention can be held in place by vacuum or by adhesive (or both) on an outer surface of a drum or metal plate. The drum-type assembly can rotate the composite material at speeds ranging from about 1 to 2000 revolutions per minute. Higher speeds can be used to reduce processing time.

Spot size of the laser beam (or beam diameter) can be set at a focus distance of from between, and including, any two of the following numbers, 1, 2, 4, 6, 8, 10, 15, 20 or 25 microns, typically 12 or 18 microns. Average exposures (i.e., energy dosages) can be from between and including any two of the following numbers 0.1, 0.5, 1.0, 2, 4, 6, 8, 10, 15 or 20 J/cm². In at least two examples of the present invention 4 and 8 J/cm² was used.

In one embodiment of the present invention, a digital pattern of a printed circuit board is contained in an 'image file' and can be used to direct light (e.g., laser light) to a desired portion (i.e., locations) on the surface of the polymer composite. Software is employed to store information regarding the location of lines, spaces, curves, pads, holes, and other information such as pad diameter, pad pitch, and hole diameter. This data is can be stored in digital memory that is readily accessible to AOM electronic devices.

Typically, laser light is controlled by a computer and moves in an organized, predetermined, pixel-by-pixel (line-by-line or vector) fashion across a panel or composite surface. The fine features of a circuit pattern(s) are inscribed on the composite's surface. As such, the combination of light sources, the scanning, the beam modulation, the digital pattern transfer, and the mechanical conditions (many of the stated above) are all used to determine the particular circuit pattern ultimately desired.

In one embodiment, a composite material can also be loaded (i.e., filled with) an 'absorber' material. The 'absorber' material can be optimized (or specifically chosen) in order to obtain a certain optical density of the composite material (the optical density measured at a particular wavelength of light used for the exposure step). For example, an optical density of 1.0, for each 10 microns of composite material thickness, can be an effective optical density for many materials of the present invention. Useful optical density ranges can be from about 0.1 to about 5.0 per 10 microns of material thickness.

In one embodiment of the present invention, metal is subsequently applied to the light-activated portions of the polyimide films of the present invention after light activation. For these composites, metal can be plated onto a surface using an 'electroless' plating bath in an electroless plating step. The plating baths typically contain a copper ion source, a reducing agent, an oxidizing agent, a chelating agent, as well as trace amounts of other functional additives.

Variables that can control the speed and quality in which a plating bath can plate metal onto a film's surface are temperature of the plating bath, the amount of surface to be plated, the chemical balance of the solution (e.g., replenishing the plating solution with a substance that has been consumed), and the degree of mechanical agitation. Typically, the temperature range of a plating bath is controlled at a temperature between room temperature and about 70 to 80° C. The temperature is adjusted according to the type, and amount, of chelating agent (and other additives) used.

Digitally imaged circuits can be electroless copper plated by using a two step plating bath or a single step, 'full-build' plating bath process. First, the polyimide composites of the present invention are digitally imaged by a light activation step. Light activation debris, or miscellaneous particles, can be removed by mechanical brushing, air, or ultra-sonification to clean the material before electroless copper-plating begins. After cleaning (which is optional), the material can be submerged into the first of two electroless copper-plating baths. The material is placed in the first bath for about seven to ten minutes in order to establish a 'second electrode' of copper on the light activated areas. After a distilled water rinse, the material can then be submerged into a second electroless copper-plating bath for two to two-and-a-half hours. The second copper plating bath can build up a copper thickness, over the second electrode copper layer, of approximately twelve to twenty microns.

The advantages of the materials present invention are illustrated in the following EXAMPLES. Processing and test procedures used in preparation of, and testing, of the polyimides of the present invention (and compositions containing these polyimides) are described below.

EXAMPLES

The following examples were prepared from a polyamic acid blended with a dispersion of the below mentioned spinel crystal fillers. The polyamic acid was derived from equimolar amounts of dianhydride(s) and diamine(s).

Example 1

A slurry was prepared by first, adding 730 g of dimethyl acetamide (DMAc) to a beaker. The beaker was then mounted under a laboratory scale Silverson® kinetic shearing mixer, and the solvent was stirred at ~3000 rpm. A 14.25 wt % polyamic acid solution in DMAc, derived from 4,4'-oxydianiline, p-phenylene diamine, pyromellitic dianhydride, and 3,3',4,4'-biphenyltetracarboxylic dianhydride was then added to the beaker to aid in the dispersion of the filler. The viscosity of the polymer was 100 poise prior to mixing. In this example, 120 g of the polyamic acid solution was used.

Next, 150 g of fine $CuCr_2O_4$ powder (Black 20C980 from Shepherd Powder Co.) was added and allowed to mix in the DMAc for ~5 minutes. The dispersion was then transferred to a continuous media mill (Netzsch Zeta Mill II) and milled 15 minutes to achieve a final average filler particle size of 1.1-1.5 microns.

After, 117.2 grams of the above slurry was then uniformly mixed, using a Silverson high shear lab mixer with 66.8 g of Ticon CN barium titanate powder (from Ferro Co.). After the slurry of the two powders was uniformly mixed, forty-six grams of this filler mixture was then mechanically stirred into 150 grams of 15 weight-percent polyamic acid solution derived 4,4'-oxydianiline, p-phenylene diamine, pyromellitic dianhydride, and 3,3',4,4'-biphenylenetetracarboxylic dianhydride.

The two-filler, one polymer, mixture was centrifuged for 2-3 minutes at a sufficiently high rotational speed to remove bubbles. The viscosity of the mixture was then adjusted to 1000 poise by addition a small amount of 6 weight-percent pyromellitic dianhydride solution in DMAc.

Next, a thin sheet of filled polymer was cast onto a glass plate to form a wet film. The thickness of the wet film was adjusted in order to obtain a dry film thickness of about a 2 mil (50 microns). The glass plate was heated on a hotplate at 125° C. for ~30 minutes. The film was peeled from the plate and placed on a pin frame where the edges of the film were bound.

Then, the pin-framed film was further heated to dry (>99% solids) and imidize the film by ramping it in a Blue M oven from 150° C. to 250° C. in a nitrogen atmosphere over 1 hour and placed in another Blue M oven (also containing a nitrogen atmosphere) at 400° C. for 5 minutes.

The final film contained approximately 10 percent by weight $CuCr_2O_4$ (Black 20C980 from Shepherd Powder Co) and 40 percent by weight barium titanate powder (Ticon CN from Ferro Co) in polyimide. The film had a dielectric constant of about 12 and the film was light activatable by a laser beam, and was plated with a metal (in a plating bath) on the light activated areas.

Comparative Examples 1-8

A 17.5 weight-percent polyamic acid solution was derived from 4,4'-oxydiphthalilc anhydride, pyromellitic dianhydride, and 1,3-bis-(4-aminophenoxy)benzene (RODA) dissolved in DMAc. The viscosity of this polymer solution began at 50 poise prior to casting. Barium titanate was added to achieve a variety of weight percent loading of the filler in the polymer.

The viscosity of the filled polymer was raised to 500 poise after the filler was added by adding an additional amount of PMDA (dissolved in a 6 percent by weight solution DMAc).

Next, a thin sheet of mixed polymer was cast onto a stainless steel belt to form a wet film. The thickness of the wet film was adjusted in order to obtain a dry film thickness, after curing, of about a 2 mil (50 microns).

The metal belt was heated in an oven and ramped from 90° C. to 140° C. over ~15 minutes. The film was peeled from the belt and pinned on a tenter frame where the edges of the film were bound.

Then, the tentered film was further heated to dry (>99% solids) the film and imidize the polymer to a polyimide. The film was transported through a drying oven where temperature was ramped from 200 C to in excess of 350 C over a 10-30 minute period The final films produced contained approximately from 0 to 73 weight percent barium titanate powder (Ticon CN from Ferro Co) evenly dispersed in a polyimide binder. While many of these films showed an adequate dielectric constant (making them suitable for use as a thin film capacitor) none of the comparative examples were light activatable under laser light and could not be plated using the plating bath of Example 1. The table below defines 'light activatable' as a material that, once light activated, can receive metal deposited from a metal plating bath.

TABLE 1

| Comp. Ex. No. | BaTiO$_3$ (wt. %) | Dielectric Constant (1 MHz.RT) | Elongation Percent (%) | Light Activatable (Y/N) |
|---|---|---|---|---|
| 1 | 0 | 3.8 | 48.9 | N |
| 2 | 15 | 4.7 | 32.2 | N |
| 3 | 30 | 9.8 | 19.2 | N |
| 4 | 40 | 11.7 | 12.6 | N |
| 5 | 50 | 15.2 | 8.4 | N |
| 6 | 56 | 17.3 | 4.7 | N |
| 7 | 63 | 26.6 | 3.0 | N |
| 8 | 73 | 32.0 | 2.5 | N |

Comparative Example 9

A polyamic acid of pyromellitic dianhydride (PMDA) and 4,4-diaminodiphenylether (4,4'-ODA) was prepared at a 20 weight percent solution in dimethylacetamide (DMAc). The reaction was allowed to proceed, and polymerized up to 99.5% stoichiometry (i.e., a slight deficiency of dianhydride component). The polyamic acid solution had a viscosity of 2300 poise. Conversion chemicals added consisting of about 2.6 moles of acetic anhydride and 2.5 moles of beta-picoline (both dissolved in DMAc) to form a 15 weight percent polyamic acid casting-solution. The polyamic acid had added to it no spinel crystal structure, nor any capacitance filler (e.g., Ticon CN barium titanate).

The polyamic acid was cast onto a drum having a surface temperature of 90° C. The polyamic acid film was stripped off the drum at 15-20 weight percent solids having undergone some imidization. The film was stretched in the machine direction by a factor or 1.17. The film was pinned on tenter frame and stretched in an effort to achieve orientation isoptropy to about 1.30, in the transverse direction using a tenter chain. During transverse directional stretching, the film was also heated about 260° C. with hot air. After this heating and stretching step, the film was dried to about 93 to 95 weight percent solids. The film was then removed from tenter clips and cured (and dried) to a polyimide using hot air at a temperature of about 400° C. for about 2 min, and then 440° C. for an additional 2 minutes.

The final film had a dielectric constant of about 3.9 and was able to be plated on the light-activated portions of the film.

What is claimed is:

1. A laser light activatable polymer composite comprising:
   A. a polymer selected from the group consisting of epoxy resins, bismaleimide triazines, fluoropolymers, liquid crystal polymers, and combinations thereof present in an amount from 12 to 87 weight-percent of the total weight of the polymer composite;
   B. a spinel crystal filler being a member of the group consisting of $AB_2O_4$, $BABO_4$ and combinations thereof, where A is a metal cation having a valence of 2 selected from the group consisting of manganese, nickel, copper, iron and combinations of two or more of these, and where B is a metal cation having a valence of 3 selected from the group consisting of manganese, iron, chromium, and combinations of two or more of these, the spinel crystal filler being present in an amount from 3 to 25 weight-percent of the total weight of the polymer composite;
   C. a capacitor filler present in an amount from 10 to 85 weight-percent of the total weight of the composite material, wherein the capacitor filler is a member of the group consisting of:
      i. a ferroelectric filler selected from the group consisting of lead zirconate titanate, barium titanate, calcium, bismuth, iron, lanthanum, strontium, lead meta-niobate, lead metatantalate, strontium barium titanate, sodium barium niobate, potassium barium niobate, and rubidium barium niobate,
      ii. a paraelectric filler selected from the group consisting of $TiO_2$, $Ta_2O_5$, $HfO_2$, $Nb_2O_5$, $Al_2O_3$, and steatite, and
      iii. a combination of said ferroelectric filler and said paraelectric filler;
   wherein the polymer composite material has a thickness ranging from 1 to 200 microns;
   and wherein the polymer composite material has a dielectric constant between and including 4 and 60.

2. A laser light activatable material in accordance with claim 1 wherein the material is used as a capacitor substrate in a rigid circuit board.

3. A laser light activatable material in accordance with claim 1 wherein the material is used as a capacitor substrate in a flexible circuit board.

4. A laser light activatable material in accordance with claim 1 wherein the material is used as a capacitor substrate in a rigid-flex circuit board.

5. A laser light activatable material in accordance with claim 1 wherein the material is used as a capacitor substrate in a multi-layer flexible circuit board.

6. A laser light activatable material in accordance with claim 1 wherein the material is used as a component in an integrated circuit package.

7. A laser light activatable material in accordance with claim 1 wherein the material is used as a component in an electronic package wherein the electronic package is selected from the group comprising an interconnect in a pin grid array, a multi-chip module, a chip-scale package, a ball grid array, a radio frequency module, a digital module, chip-on-flex, a stacked via substrate, a printed circuit board having embedded passive devices, a high density interconnect circuit board, an "LGA" Land grid array, an "SOP" (System-on Package) Module, a "QFN" Quad Flat package-No Leads, and a "FC-QFN" Flip Chip Quad Flat package-No leads.

8. A laser light activatable material in accordance with claim 1 wherein the material is used as a component in a high density interconnect, a wafer scale package, a tape automated bonding circuit package, in a chip-on-flex circuit package, or a chip-on-board electronic circuit package.

9. A laser light activatable material in accordance with claim 1 wherein the material is used in a three-dimensional electronic circuit package.

10. A laser light activatable material in accordance with claim 1 wherein the material is in the form of a film, wherein a laser is used to light activate a pattern on one side of said film, and wherein a metal is plated on the light activated pattern.

11. A laser light activatable material in accordance with claim 1 wherein the material is in the form of a film, wherein a laser is used to light activate a pattern on both sides of said film and wherein a metal is plated on the light activated patterns.

* * * * *